(12) United States Patent
Su et al.

(10) Patent No.: US 7,429,795 B2
(45) Date of Patent: Sep. 30, 2008

(54) BOND PAD STRUCTURE

(75) Inventors: Wen-Tsai Su, Miaoli Hsien (TW);
Chin-Chi Shen, Hsinchu (TW);
Ming-Jer Chiu, Hsinchu (TW);
Chih-Chiang Chen, Ilan Hsien (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 349 days.

(21) Appl. No.: 11/236,217

(22) Filed: Sep. 27, 2005

(65) Prior Publication Data
US 2007/0090402 A1 Apr. 26, 2007

(51) Int. Cl.
*H01L 23/48* (2006.01)
(52) U.S. Cl. ........................ 257/734; 257/746
(58) Field of Classification Search .......... 257/734, 257/746
See application file for complete search history.

(56) References Cited
U.S. PATENT DOCUMENTS 5,923,088 A * 7/1999 Shiue et al. ................ 257/758
6,236,494 B1 * 5/2001 Onoe et al. ................. 359/332
6,417,087 B1 * 7/2002 Chittipeddi et al. ......... 438/612
6,531,384 B1   3/2003 Kobayashi et al. .......... 438/612
7,169,694 B2 * 1/2007 Pozder et al. ............... 438/612
2005/0093176 A1 5/2005 Hung et al.

OTHER PUBLICATIONS

CN Office Action mailed Nov. 19, 2007.

* cited by examiner

*Primary Examiner*—Roy K Potter
(74) *Attorney, Agent, or Firm*—Thomas, Kayden, Horstemeyer & Risley

(57) ABSTRACT

Bond pad structures are presented. Some embodiments of the structure include a conductive conductor-insulator layer overlying a substrate. The conductive conductor-insulator layer includes a composite region having a conductor sub-region and insulator sub-region, which neighbor each other, and a single material region. The insulator is harder than the conductor.

23 Claims, 10 Drawing Sheets

BOND PAD STRUCTURE

BACKGROUND

The invention relates generally to a semiconductor device, and more specifically to a bond pad structure overlying a substrate.

FIG. 1A shows a cross-section of a conventional bond pad structure 1 with a conductive layer 110 and dielectric layer 120 on a substrate 100. The substrate 100 has a plurality of active devices and interconnections (both not shown). The conductive layer 110 is usually copper, electrically connecting to the interconnections of the substrate 100. A dielectric 120 isolates the conductive layer 110 from unwanted electrical connection to other devices (not shown). A passivation layer 150, with an opening 152 exposing the conductive layer 110, is formed on the dielectric layer 120 and conductive layer 110. The conductive layer 110 is an I/O port to electrically connect the substrate 100 to an external device (not shown). When the conductive layer 110 is copper, corrosion will start at the grain boundaries on the surface of the conductive layer 110 and proceed along the grain boundaries deeper into the conductive layer 110 when exposed to the atmosphere. Therefore, a metal layer 140, usually aluminum-copper alloy, overlying the conductive layer 110 is normally necessary to protect the conductive layer 110 from corrosion. A barrier layer 130 between the conductive layer 110 and metal layer 140 prevents unwanted inter-diffusion between the conductive layer 110 and metal layer 140 as needed. A passivation layer 160, with an opening 162 exposing the metal layer 140, is formed on the passivation layer 150 and metal layer 140. Both passivation layers 150 and 160 protect the substrate 100 from damage from moisture, oxygen, particles, and other corrosive factors or contaminants. Both passivation layers 150 and 160 further isolate the metal layer 140 from unwanted electrical connection to other devices (not shown).

When the wafer fabricating process is complete, a wafer probing process is performed to test functions of the substrate 100. In FIG. 1B, the wafer probing process is shown. A probe 180, usually tungsten, is provided to contact the bond pad structure 1. The probe 180 is needle-like and much harder than the metal layer 140 and conductive layer 110, so the probe 180 can penetrate the metal layer 140 into the conductive layer 110. The probe 180 may further slide during probing from vibration of the testing apparatus (not shown) or other factors. Therefore, the metal layer 140 may be completely or partially peeled from the conductive layer 110.

In FIG. 1C, the metal layer 140 is partially peeled from the conductive layer 110 after the wafer probing process, forming an opening 170 exposing parts of the conductive layer 110. Furthermore, the bond pad structure 1 may be tested a number of times for different functions, so multiple openings 170 may be formed. Thus, the exposed conductive layer 110 may corrode from the reaction with oxygen, moisture, and/or other corrosive factors, forming a corrosive layer 172 thereon when the substrate 100 is exposed to the atmosphere.

When the substrate 100 is packaged, the corrosive layer 172 often further negatively affect the yield of the packaging process or reliability of the complete package. In FIG. 1D, a gold wire 190 with a gold ball 192 is bonded to the bond pad structure 1, specifically on the metal layer 140. The gold ball 192 cannot bond to the corrosive layer 172, reducing the effective bonding area between the gold ball 192 and the bond pad structure 1 and weakening the bonding strength therebetween. The gold ball 192 may separate along the corrosive layer 172, creating bond-off-pad defect, during the molding step of the packaging process from the mold flow. If the gold ball 192 does not separate during the molding step, subsequent thermal steps of the packaging process or the complete package may also cause separation on the gold ball 192.

SUMMARY

Embodiments of the invention provide a bond pad structure that limits damage during probing of the bond pad structure.

Embodiments of the invention further provide effective contrast between a bond pad structure and a neighboring area, such as a passivation layer, to limit damage when probing the bond pad structure.

Embodiments of the invention provide bond pad structures. An embodiment of the structure comprises a conductive conductor-insulator composite layer overlying a substrate. The conductive conductor-insulator composite layer comprises a composite region and a single material region that neighbors the composite region. The composite region has a conductor sub-region and insulator sub-region, which neighbor each other. Further, the insulator is harder than the conductor.

BRIEF DESCRIPTION OF THE DRAWINGS

The invention can be more fully understood by reading the subsequent detailed description in conjunction with the examples and references made to the accompanying drawings, which are given by way of illustration only, and thus are not limitative of the invention, and wherein.

DESCRIPTION

The following embodiments are intended to illustrate the invention more fully without limiting the scope of the claims, since numerous modifications and variations will be apparent to those skilled in the art.

Figure 1A:
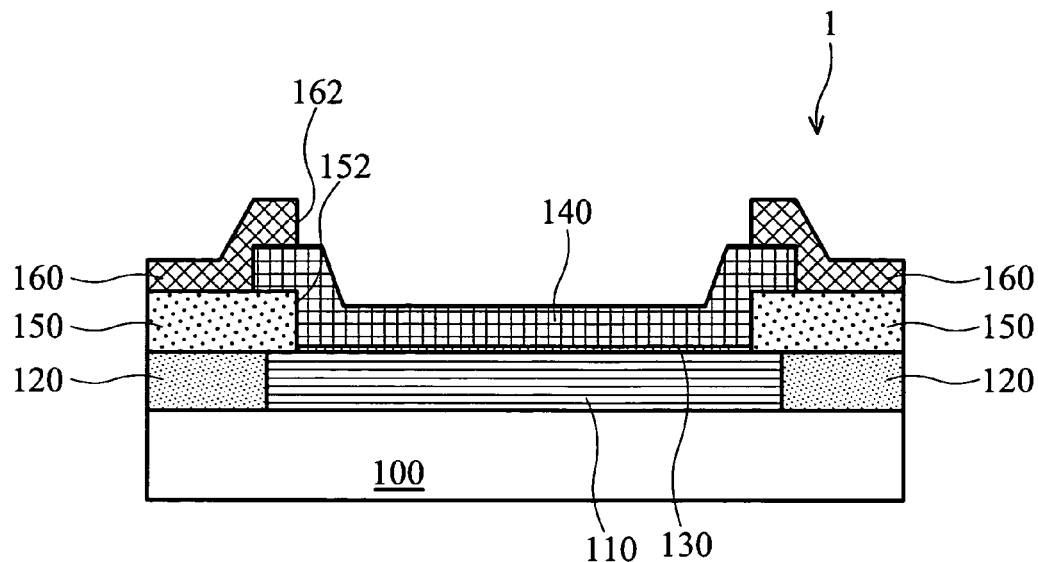
FIGS. 1A through 1D are cross-sections of a conventional bond pad structure.
Figure 1B:
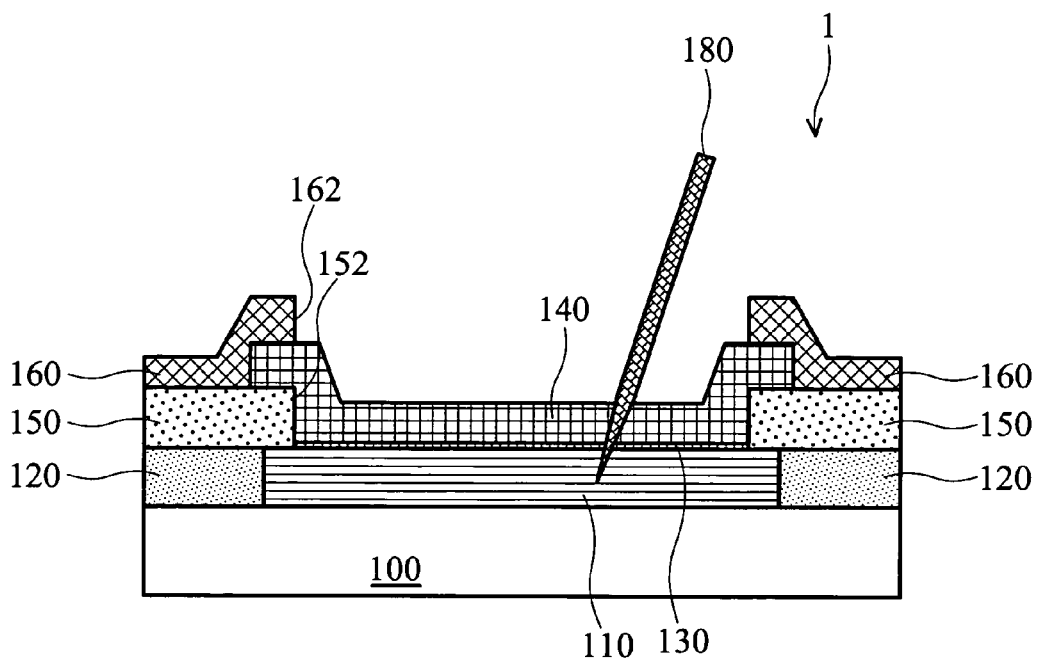
Figure 1C:
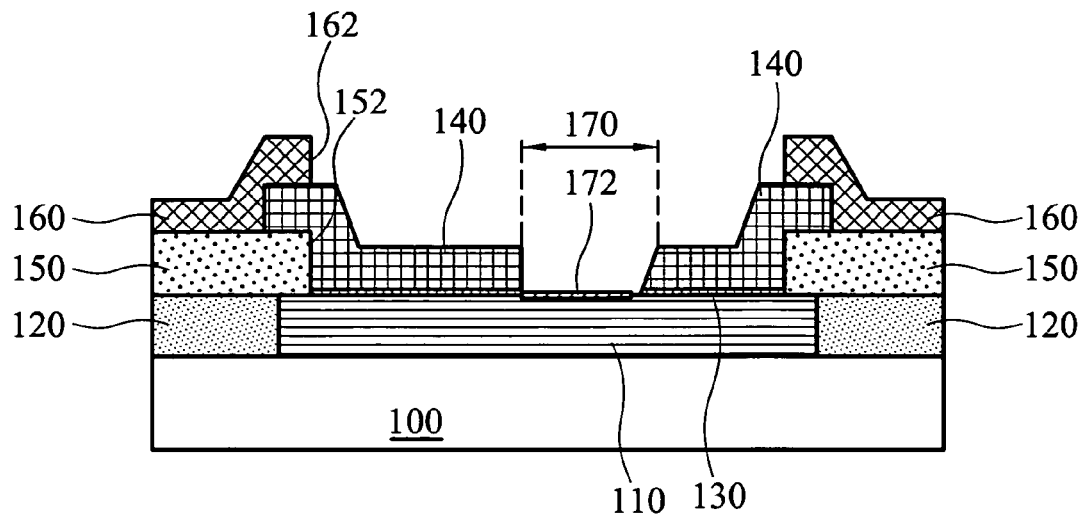
Figure 1D:
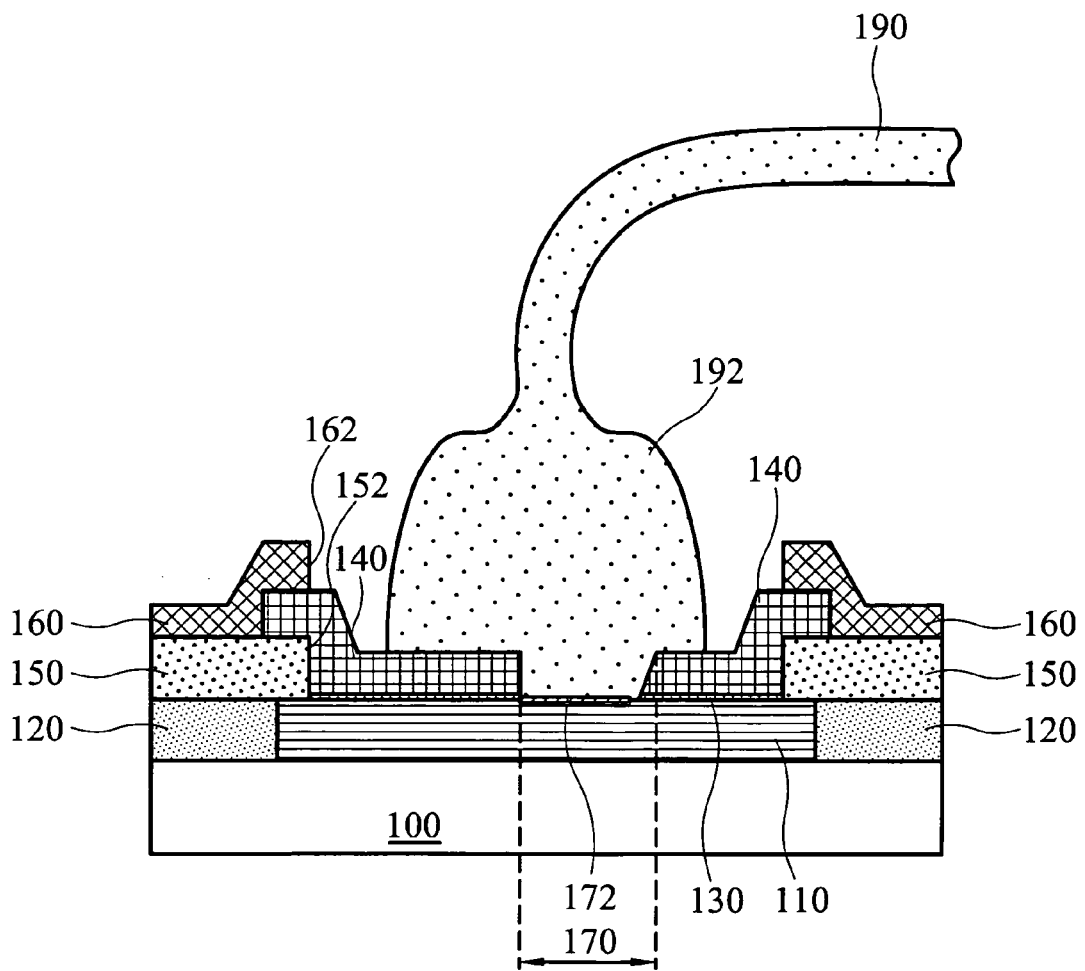
Figure 2A:
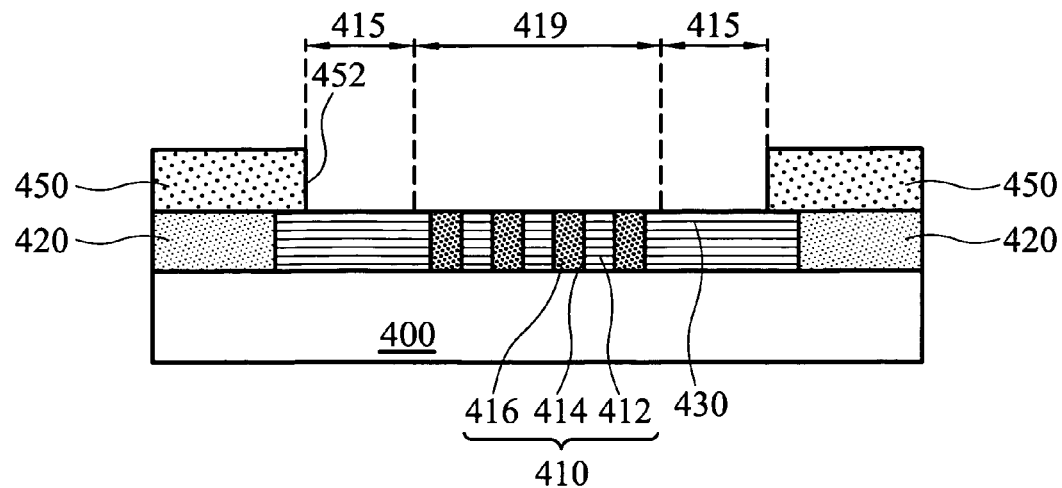
FIGS. 2A through 2D are cross-sections of a bond pad structure in accordance with an embodiment of the invention.

In FIG. 2A, a conductor-insulator composite layer 410 overlying substrate 400 is provided. The conductor-insulator composite layer 410 is conductive to electrically connect active devices (not shown) of substrate 400 to an external device (not shown). The conductor is usually metal, such as copper or other metallic elements. The insulator is harder than the conductor to protect the conductor-insulator composite layer 410 from damage. The insulator is usually an oxide, preferably silicon oxide or other material usually used as a dielectric layer in interconnections (not shown) of the substrate 400. The conductor-insulator composite layer 410 preferably comprises a composite region 419 and a single material region 415. The composite region 419 has a conductor sub-region and an insulator sub-region, which neighbor each other.

The conductor-insulator composite layer 410 is preferably a copper layer 412 comprising a slot 414. The slot 414 comprises a silicon oxide layer 416 therein in the composite region 419. The single material region 415 is a slotless region of copper. Composite region 419 is a slotted region.

In FIG. 2A, a dielectric layer 420 around the conductor-insulator composite layer 410 isolates the conductor-insulator composite layer 410 from unwanted electrical connection to other devices (not shown). A passivation layer 450, comprising an opening 452 exposing the conductor-insulator composite layer 410, is formed on the conductor-insulator composite layer 410 and dielectric layer 420 to protect substrate 400 from damage from moisture, oxygen, particles, or other corrosive factors or contaminants.

Figure 2B:
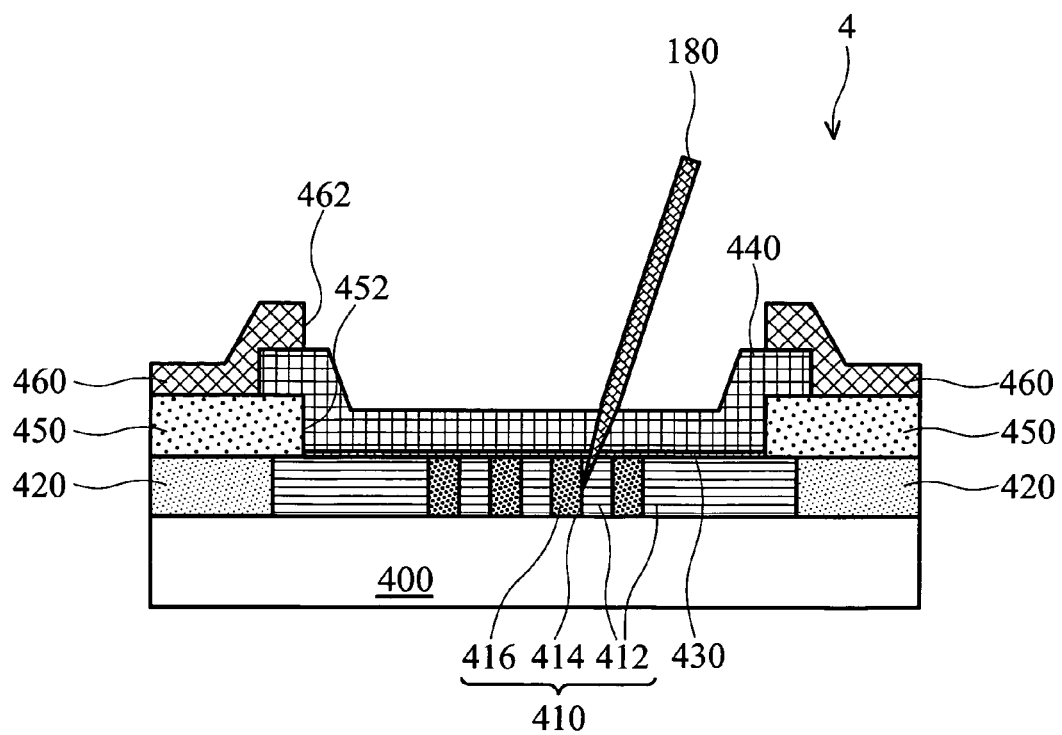

In FIG. 2B, first, a barrier layer 430 such as TaN is optionally formed on the conductor-insulator composite layer 410. Next, a metal layer 440 such as aluminum-copper alloy is formed on the barrier layer 430. Due to the distribution of the slot 414 and the silicon oxide layer 416 therein, the surface of metal layer 440 above the composite region 419 is more or less uneven, irrespective of planarization on the metal layer 440. However, the surface of metal layer 440 follows the planarity of the underlying single material region 415. Then, a passivation layer 460 is formed overlying the substrate 400. The passivation layer 460 protects substrate 400 and isolates the metal layer 440 from unwanted electrical connection to other devices (not shown). Finally, the passivation layer 460 is patterned to form an opening 462 exposing the metal layer 440, thereby forming the bond pad structure 4 of the embodiment and completing the wafer fabrication process.

In FIG. 2B, when the bond pad structure 4 is probed, sliding probe 180 is effectively stopped by silicon oxide layer 416. Damage to bond pad structure 4 is limited.

Figure 2C:
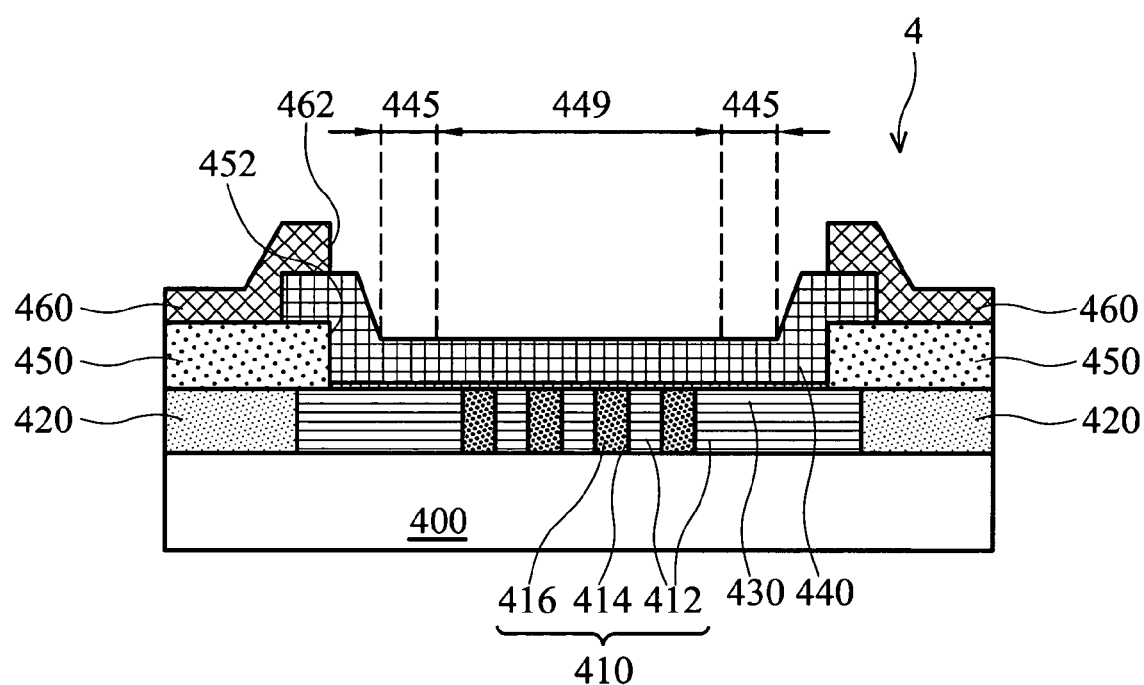

In FIG. 2C, at the wire-bonding step, incident light beams (not shown) from a visual system (not shown) of a wire-bonding apparatus (not shown) are scattered by the uneven surface 449 of metal layer 440 above the composite region 419 (shown in FIG. 2A). However, the planar surface 445 of metal layer 440 above the single material region 415 (shown in FIG. 2A) provides effective light reflection, providing effective contrast between the metal layer 440 and the neighboring passivation layer 460 for the wire-bonding apparatus.

Figure 2D:
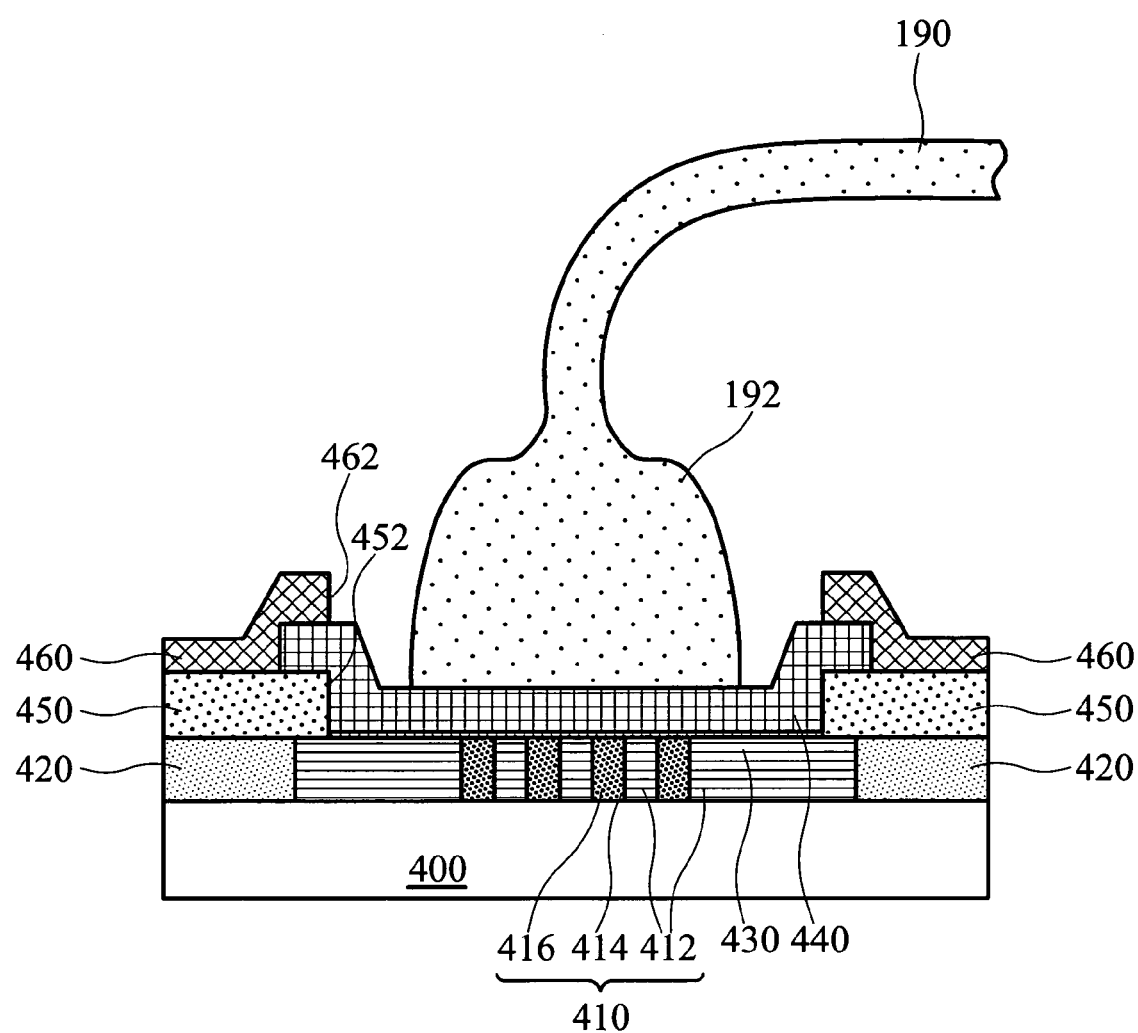

Further, in FIG. 2D, a gold wire 190 with a gold ball 192 is bonded to the metal layer 440 of bond pad structure 4. Due to damage to bond pad structure 4 is limited, metal layer 440 is not peeled. The metal layer 440 still effectively protects the conductor-insulator composite layer 410 from corrosion. Thus, the effective bonding area between the gold ball 192 and the bond pad structure 4 is not reduced, improving bondability and reliability therebetween.

Two layouts of the conductor-insulator composite layer 410 in this embodiment are disclosed as examples here, and are not intended to limit the invention. Modifications to the subsequent layouts will be apparent to those skilled in the art.

Figure 3A:
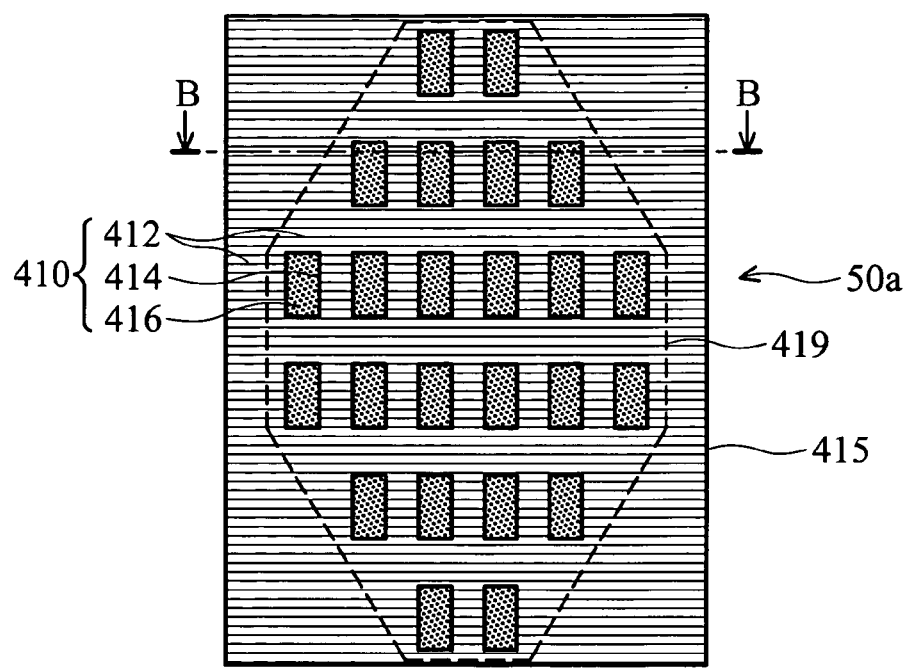
FIGS. 3A and 3B are top views illustrating examples of layout of the bond pad structure shown in FIGS. 2A through 2D.

In FIG. 3A, a top view of a layout 50a designed for the conductor-insulator composite layer 410 in opening 452 in FIG. 2A is shown. In the layout 50a, the distribution of the slots 414, comprising the silicon oxide layer 416 therein, forms an octagonal composite region 419 (slotted region) at the center of the conductor-insulator composite layer 410. The single material region 415 (slotless region) is in the periphery of the conductor-insulator composite layer 410 and around the composite region 419. The single material region 415 comprises a planar surface. The surface of the subsequently formed metal layer 440 above the single material region 415 may also be planar, providing effective contrast between the metal layer 440 and the neighboring passivation layer 460 when processing the wire-bonding step as disclosed in FIG. 2C. A cross-section of the layout 50a along the line BB is similar to that shown in FIG. 2A in the opening 452.

Figure 3B:
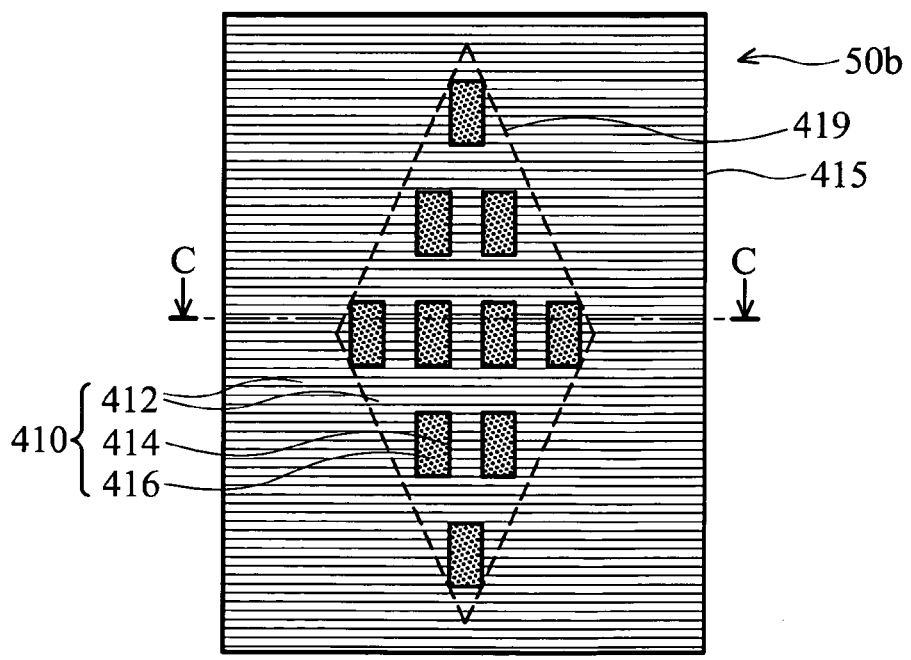

In FIG. 3B, a top view of a layout 50b designed for the conductor-insulator composite layer 410 in opening 452 in FIG. 2A is shown. In the layout 50b, the distribution of slots 414, comprising the silicon oxide layer 416 therein, forms a diamond-shaped composite region 419 (slotted region) at the center of the conductor-insulator composite layer 410. The single material region 415 (slotless region) is in the periphery of the conductor-insulator composite layer 410 and around the composite region 419. The single material region 415 comprises a planar surface. The surface of the subsequently formed metal layer 440 above the single material region 415 may also be planar, providing effective contrast between the metal layer 440 and the neighboring passivation layer 460 when processing the wire-bonding step as disclosed in FIG. 2C. A cross-section of the layout 50b along the line CC is similar to that shown in FIG. 2A in the opening 452.

Figure 4A:
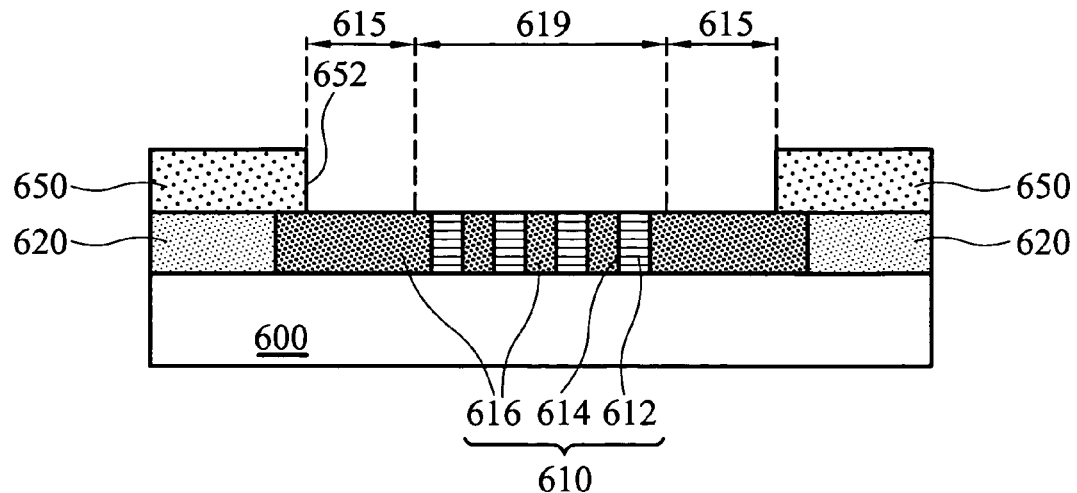
FIGS. 4A through 4D are cross-sections of a bond pad structure in accordance with another embodiment of the invention.

In FIG. 4A, a conductor-insulator composite layer 610 overlying the substrate 600 is provided. The conductor-insulator composite layer 610 is conductive to electrically connect active devices (not shown) of the substrate 600 to an external device (not shown). The conductor is usually metal, such as copper or other metallic elements. The insulator is harder than the conductor to protect the conductor-insulator composite layer 610. The insulator is usually an oxide, preferably silicon oxide or other material typically used as a dielectric layer in interconnections (not shown) of the substrate 600. The conductor-insulator composite layer 610 preferably comprises a composite region 619 and a single material region 615. The composite region 619 comprises a conductor sub-region and an insulator sub-region, which neighbor each other.

The conductor-insulator composite layer 610 is preferably a silicon oxide layer 616 comprising a slot 614, comprising a copper layer 612 therein, in the composite region 619. The single material region 615 is a slotless region of silicon oxide. The composite region 619 is a slotted region.

In FIG. 4A, the dielectric layer 620 isolates the conductor-insulator composite layer 610 from unwanted electrical connection to other devices (not shown). A passivation layer 650, comprising an opening 652 exposing the conductor-insulator composite layer 610, is formed on the conductor-insulator composite layer 610 and dielectric layer 620 to protect the substrate 600 from moisture, oxygen, particles, or other corrosive factors or contaminants.

Figure 4B:
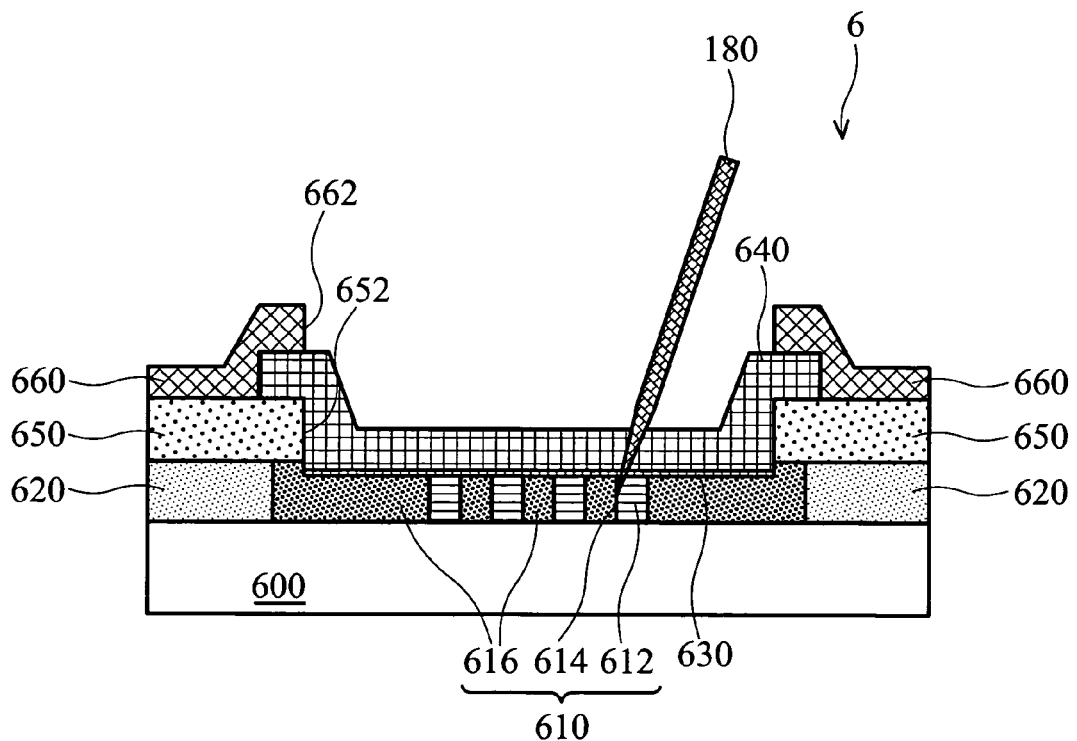

In FIG. 4B, first, a barrier layer 630 such as TaN is optionally formed on the conductor-insulator composite layer 610. Next, a metal layer 640 such as aluminum-copper alloy is formed on the barrier layer 630. Due to the distribution of the slot 614 and the copper layer 612 therein, the surface of metal layer 640 above the composite region 619 is more or less uneven irrespective of planarization on the metal layer 640. However, the surface of metal layer 640 above the single material region 615 is planar because the single material region 615 is planar. Then, a passivation layer 660 is formed overlying the substrate 600. The passivation layer 660 protects the substrate 600 and isolates the metal layer 640 from unwanted electrical connection to other devices (not shown). Finally, the passivation layer 660 is patterned to form an opening 662 exposing the metal layer 640, thereby forming the bond pad structure 6 of this embodiment and completing the wafer fabrication process.

In FIG. 4B, when the bond pad structure 6 is probed, the sliding probe 180 is effectively stopped by the silicon oxide layer 616. Damage to the bond pad structure 6 is limited.

Figure 4C:
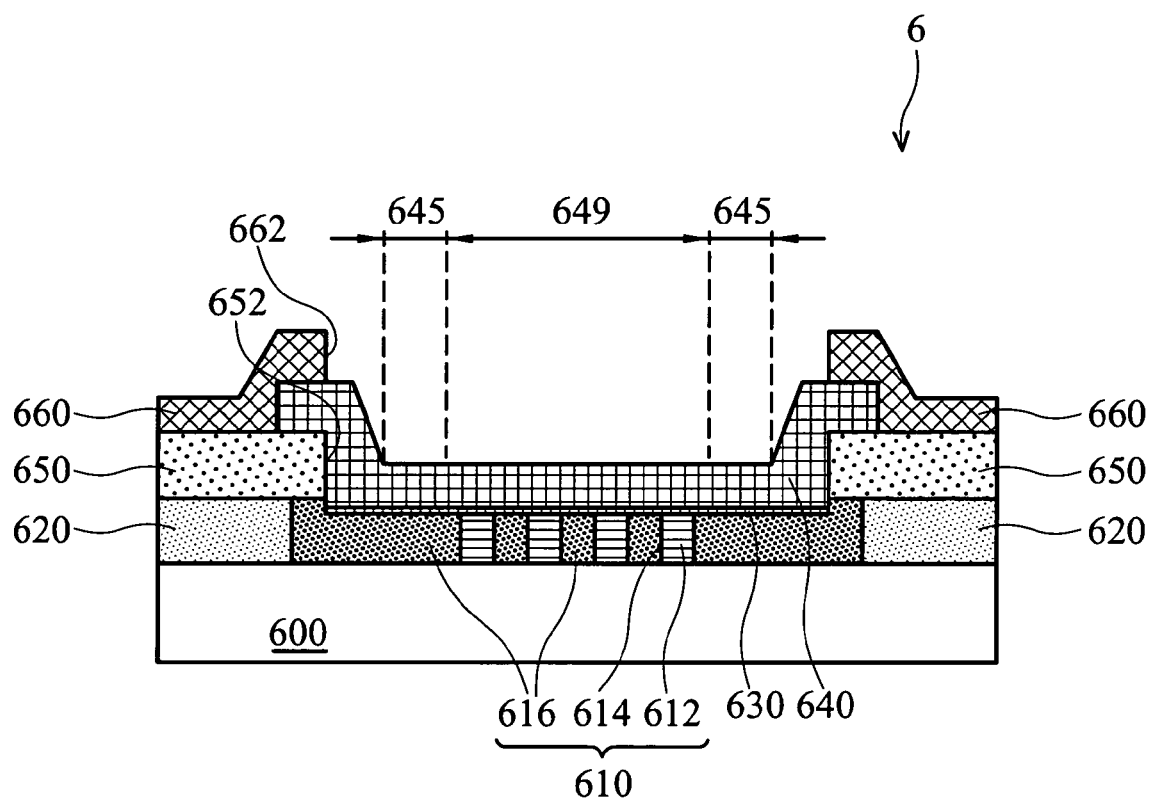

In FIG. 4C, at the wire-bonding step, incident light beams (not shown) from a visual system (not shown) of a wire-bonding apparatus (not shown) are scattered by the uneven surface 649 of metal layer 640 above the composite region 619 (shown in FIG. 4A). However, the planar surface 645 of metal layer 640 above the single material region 615 (shown in FIG. 4A) provides effective light reflection, providing effective contrast between metal layer 640 and the neighboring passivation layer 660 for the wire-bonding apparatus.

Figure 4D:
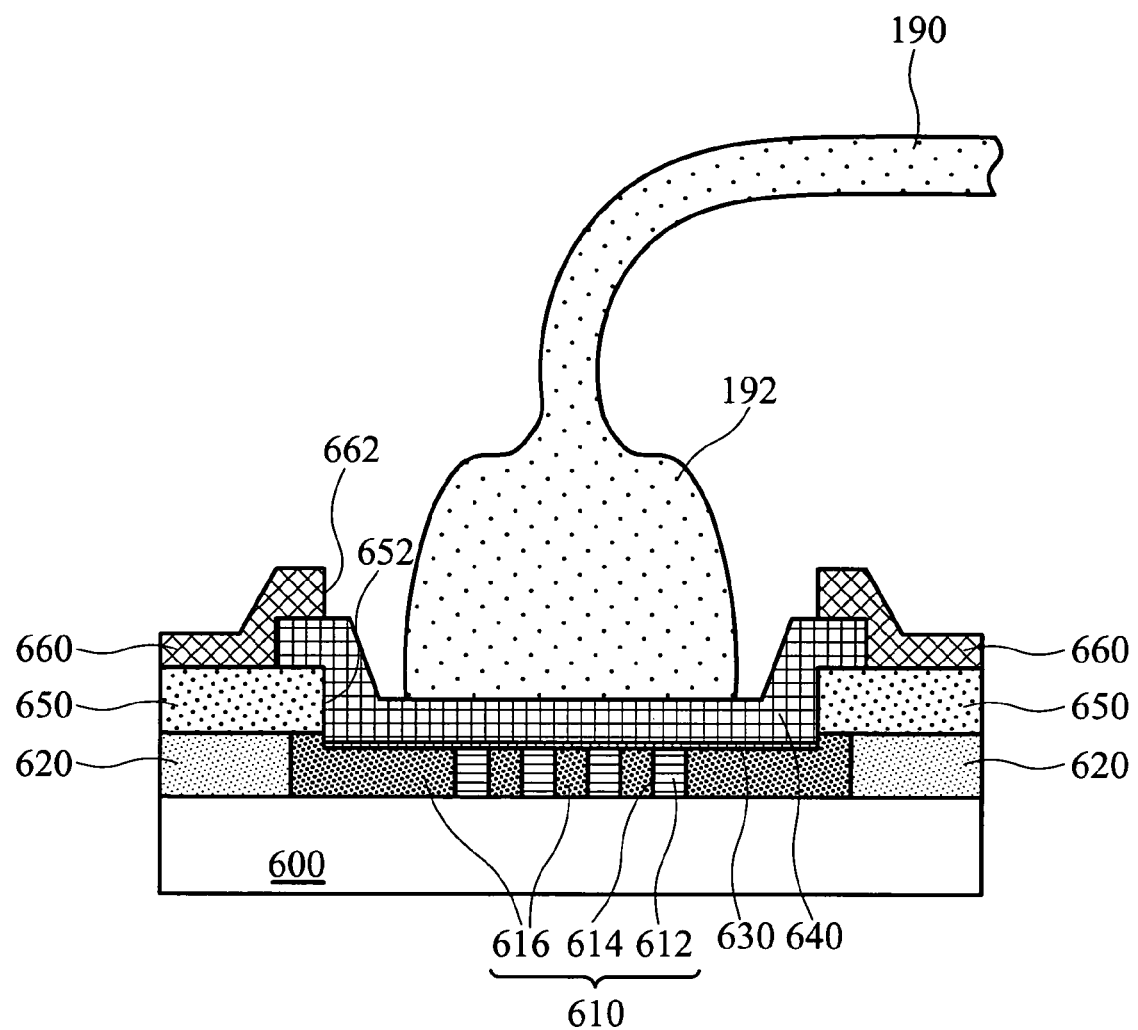

Further, in FIG. 4D, when a gold wire 190 with a gold ball 192 is bonded to the metal layer 640 of bond pad structure 6. Due to damage to bond pad structure 6 is limited, metal layer 640 is not peeled. The metal layer 640 still effectively protects the conductor-insulator composite layer 610 from corrosion. Thus, the effective bonding area between the gold ball 192 and the bond pad structure 6 is not reduced, improving bondability and reliability therebetween.

Two layouts of the conductor-insulator composite layer 610 are disclosed here as examples, and are not intended to limit the invention. It will be obvious to those skilled in the art to modify the subsequent layouts.

Figure 5A:
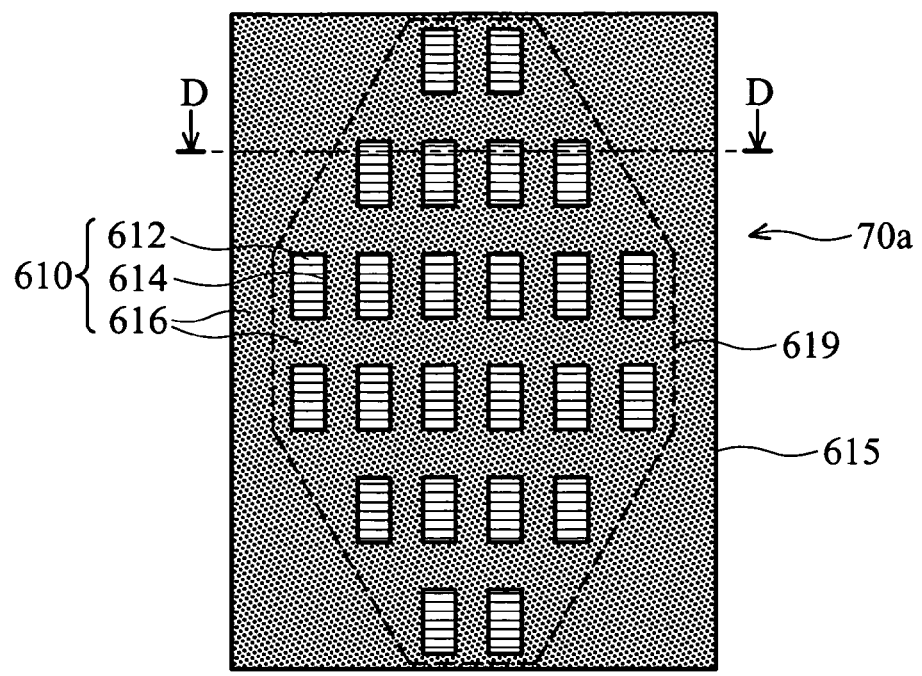
FIGS. 5A and 5B are top views illustrating examples of the layouts of the bond pad structure shown in FIGS. 4A through 4D.

In FIG. 5A, a top view of the layout 70a designed for the conductor-insulator composite layer 610 from opening 652 in FIG. 4A is shown. In the layout 70a, the distribution of the slots 614, comprising the copper layer 612 therein, form an octagonal composite region 619 (slotted region) at the center of the conductor-insulator composite layer 610. The single material region 615 (slotless region) is in the periphery of the conductor-insulator composite layer 610 and around the composite region 619. The single material region 615 comprises a planar surface. The surface of the subsequently formed metal layer 640 above the single material region 615 may also be planar, thereby providing effective contrast between the metal layer 640 and the neighboring passivation layer 660 when processing the wire-bonding step as disclosed in FIG. 4C. A cross-section of layout 70a along the line DD is similar to that shown in FIG. 4A in the opening 652.

Figure 5B:
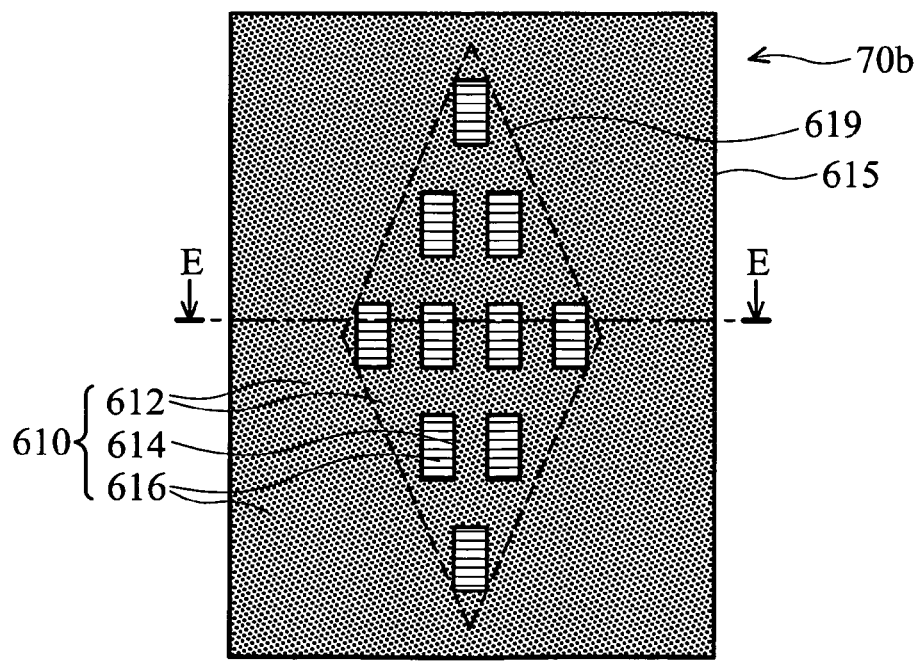

In FIG. 5B, a top view of the layout 70b designed for the conductor-insulator composite layer 610 in opening 652 in FIG. 4A is shown. In the layout 70b, the distribution of the slots 614, comprising the copper layer 612 therein, form a diamond-shaped composite region 619 (slotted region) at the center of the conductor-insulator composite layer 610. The single material region 615 (slotless region) is in the periphery of the conductor-insulator composite layer 610 and around the composite region 619. The single material region 615 comprises a planar surface. The surface of the subsequently formed metal layer 640 above the single material region 615 may also be planar, thereby providing effective contrast between the metal layer 640 and the neighboring passivation layer 660 when processing the wire-bonding step as disclosed in FIG. 4C. A cross-section of the layout 70b along the line EE is similar to that shown in FIG. 4A in the opening 652.

While the invention has been described by way of example and in terms of preferred embodiment, it is to be understood that the invention is not limited thereto. It is therefore intended that the following claims be interpreted as covering all such alteration and modifications as fall within the true spirit and scope of the invention.

What is claimed is:

1. A bond pad structure comprising:
   a conductive conductor-insulator composite layer overlying a substrate, the conductive conductor-insulator composite layer comprising:
   a composite region having a conductor sub-region and insulator sub-region, the conductor sub-region and the insulator sub-region neighboring each other; and
   a single material region neighboring the composite region;
   wherein the insulator of the conductive conductor-insulator composite layer is harder than the conductor of the conductive conductor-insulator composite layer; and
   the conductive conductor-insulator composite layer is a conductor comprising a slot in the composite region, the slot comprising an insulator therein.

2. The structure as claimed in claim 1, wherein the conductor comprises copper.

3. The structure as claimed in claim 1, wherein the insulator comprises silicon oxide.

4. The structure as claimed in claim 1, wherein the composite region is approximately at the center of the conductive conductor-insulator composite layer.

5. The structure as claimed in claim 1, wherein the single material region is in the periphery of the conductive conductor-insulator composite layer.

6. The structure as claimed in claim 1, further comprising a metal layer overlying the conductive conductor-insulator composite layer.

7. The structure as claimed in claim 6, wherein the metal layer comprises an aluminum-copper alloy layer.

8. The structure as claimed in claim 6, further comprising a barrier layer between the conductive conductor-insulator composite layer and metal layer.

9. The structure as claimed in claim 8, wherein the barrier layer comprises a TaN layer.

10. A bond pad structure comprising:
    a copper layer overlying a substrate, the copper layer comprising:
    a slotted region having a slot, the slot having an insulator layer therein, the insulator layer being harder than the copper layer; and
    a slotless region around the slotted region.

11. The structure as claimed in claim 10, wherein the insulator layer comprises silicon oxide.

12. The structure as claimed in claim 10, further comprising an aluminum-copper alloy layer overlying the copper layer.

13. The structure as claimed in claim 12, further comprising a TaN layer between the copper layer and aluminum-copper alloy layer.

14. A bond pad structure, comprising:
    a substrate;
    a conductive copper-insulator composite layer overlying the substrate; and
    a metal layer overlying the conductive copper-insulator composite layer;
    wherein the insulator of the conductive copper-insulator composite layer is harder than copper of the conductive copper-insulator composite layer, and wherein the conductive copper-insulator composite layer further comprises:
    a composite region having a copper sub-region and an insulator sub-region, the copper sub-region and the insulator sub-region neighboring each other; and
    a single material region neighboring the composite region;
    wherein the conductive copper-insulator composite layer is copper, the conductive copper-insulator composite layer having a slot in the composite region, the slot having the insulator therein.

15. The structure as claimed in claim 14, wherein the insulator comprises silicon oxide.

16. The structure as claimed in claim 14, wherein the conductive copper-insulator composite layer comprises a copper sub-region and insulator sub-region, the copper sub-region and the insulator sub-region neighboring each other.

17. The structure as claimed in claim 14, wherein the conductive copper-insulator composite layer is a copper-based layer, the copper-based layer having a slot, the slot having the insulator therein.

18. The structure as claimed in claim 14, wherein the composite region is approximately at the center of the conductive conductor-insulator composite layer.

19. The structure as claimed in claim 14, wherein the single material region is at the perphery of the conductive conductor-insulator composite layer.

20. The structure as claimed in claim 14, wherein the metal layer comprises an aluminum-copper alloy layer.

21. The structure as claimed in claim 14, further comprising a barrier layer between the conductive copper-insulator composite layer and the metal layer.

22. The structure as claimed in claim 21, wherein the barrier layer comprises a TaN layer.

23. The structure as claimed in claim 14, wherein the conductive copper-insulator composite layer is the insulator, the copper-insulator composite layer having a slot in the composite region, the slot having copper therein.

* * * * *